United States Patent
Elenes et al.

(10) Patent No.: US 8,150,346 B2
(45) Date of Patent: Apr. 3, 2012

(54) DETECTING A SIGNAL IN THE PRESENCE OF NOISE

(75) Inventors: Javier Elenes, Austin, TX (US); Dana Taipale, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 995 days.

(21) Appl. No.: 11/803,892

(22) Filed: May 16, 2007

(65) Prior Publication Data
US 2008/0287072 A1 Nov. 20, 2008

(51) Int. Cl.
*H04B 1/18* (2006.01)
(52) U.S. Cl. ............... 455/161.3; 455/161.1; 455/150.1; 455/152.1; 455/296; 455/297; 455/68; 455/69; 455/63.1; 455/63.3
(58) Field of Classification Search ............... 455/41.2, 455/500, 501, 63.1, 67.11, 67.13, 161.1–161.3, 455/226.1–226.3, 296–297, 150.1, 152.1, 455/68–69, 63.3
See application file for complete search history.

(56) References Cited

U.S. PATENT DOCUMENTS

| | | | |
|---|---|---|---|
| 4,369,521 A | | 1/1983 | Sawada |
| 5,771,438 A | | 6/1998 | Palermo et al. |
| 5,970,390 A | * | 10/1999 | Koga et al. ........................ 455/42 |
| 5,978,689 A | | 11/1999 | Tuoriniemi et al. |
| 6,006,115 A | | 12/1999 | Wingate |
| 6,052,603 A | | 4/2000 | Kinzalow et al. |
| 6,370,368 B1 | | 4/2002 | Kianush |
| 6,424,820 B1 | | 7/2002 | Burdick et al. |
| 6,493,546 B2 | * | 12/2002 | Patsiokas .................... 455/277.1 |
| 6,928,654 B2 | | 8/2005 | Tranchina et al. |
| 7,062,238 B2 | * | 6/2006 | Glaza .......................... 455/161.1 |
| 7,272,375 B2 | | 9/2007 | Tuttle et al. |
| 7,280,463 B2 | * | 10/2007 | Wildnagen et al. ........... 370/201 |
| 2003/0236075 A1 | * | 12/2003 | Johnson et al. ................. 455/99 |
| 2007/0049197 A1 | | 3/2007 | Klein |
| 2008/0096484 A1 | * | 4/2008 | Tuttle et al. ................... 455/41.2 |
| 2008/0273735 A1 | | 11/2008 | Burson et al. |

OTHER PUBLICATIONS

U.S. Appl. No. 11/529,076, filed Sep. 28, 2006, entitled "Performing A Coordinate Rotation Digital Computer (CORDIC) Operation for Amplitude Modulation (AM) Demodulation," by Dana Taipale, et al.
U.S. Appl. No. 11/529,066, filed Sep. 28, 2006, entitled "Automatic Volume Control for Amplitude Modulated Signals," by Dana Taipale, et al.
U.S. Patent and Trademark Office, Office Action mailed Dec. 23, 2009 with Reply filed on Mar. 23, 2010 in U.S. Appl. No. 11/824,569.
U.S. Patent and Trademark Office, Final Office Action mailed Jun. 8, 2010 with Reply filed on Aug. 9, 2010 in U.S. Appl. No. 11/824,569.
U.S. Patent and Trademark Office, Office Action mailed Sep. 17, 2010 in U.S. Appl. No. 11/824,569.

\* cited by examiner

*Primary Examiner* — Tuan A Tran
(74) *Attorney, Agent, or Firm* — Trop, Pruner & Hu, P.C.

(57) ABSTRACT

In one embodiment, the present invention includes a method for receiving an incoming radio frequency (RF) signal in a receiver, estimating a signal-to-noise ratio (SNR) of a constant modulus (CM) signal in the incoming RF signal based on a calculated magnitude of the incoming RF signal, and indicating presence of a modulated signal in the incoming RF signal if the estimated SNR is greater than a threshold.

21 Claims, 6 Drawing Sheets

DETECTING A SIGNAL IN THE PRESENCE OF NOISE

BACKGROUND

In radio systems, signal detection methods are performed to determine presence of a valid signal at a given frequency of a radio spectrum. Methods that resort to demodulation of the signal are fundamentally limited by the performance of the demodulator. For example, FM demodulator performance is inherently limited by the effects of impulse noise at low signal-to-noise ratios (SNRs). In some cases, correlation techniques can be applied prior to demodulation, however these require that a fixed pattern (known to the receiver) be embedded in the transmitted signal, which is not practical for a broadcast signal. Methods that resort to computing the received signal strength (noise power plus signal power) are fundamentally limited in the sense that they do not distinguish between noise power and signal power and therefore are not very useful for negative SNR values.

For example, post-demodulation methods typically demodulate an incoming RF signal and perform filtering such as bandpass filtering. The resulting filtered signal then has its power integrated over time. Such post-demodulation signal detection is fundamentally limited by the modulator performance. However, a demodulator breaks down at low SNRs due to impulses. Accordingly, large amounts of data are needed. For example, approximately 2 seconds of data are needed to detect the presence of a signal at a SNR of −3 dB, which can be unsuitable for real-time detection in a radio system. Accordingly, post-demodulation methods are generally unsuitable for determining whether a RF signal such as an FM signal is present at a given channel. A need thus exists for improved methods of signal detection, particularly at low or negative SNR levels.

SUMMARY OF THE INVENTION

In one aspect, the present invention includes a method for receiving an incoming radio frequency (RF) signal in a receiver, providing the incoming RF signal to an estimator to estimate a signal-to-noise ratio (SNR) of a constant modulus (CM) signal in the incoming RF signal based on a calculated magnitude of the incoming RF signal, and indicating presence of a modulated signal in the incoming RF signal if the estimated SNR is greater than a threshold. In this way, the SNR can be estimated without demodulating the incoming RF signal. According to one aspect, a digital signal processor (DSP) may be used to perform the estimation, and more specifically a coordinate rotation digital computer (CORDIC) function may be used. Different manners of performing the estimation may be used such as performing a maximum log likelihood analysis or a moments analysis, for example.

By performing this estimation of SNR a blind scan process may occur to select a candidate frequency (e.g., having a lowest SNR estimate) for transmission of audio content from a transceiver to a remote radio receiver. This may enable improved reception by the remote receiver, which may be a car stereo of a car in which the transceiver is located, e.g., in a portable media player.

In another aspect, the present invention includes a transceiver with a low noise amplifier (LNA) to amplify an incoming RF signal, a mixer to downconvert the RF signal to a second frequency signal, a digitizer to digitize the second frequency signal, and a processor to determine presence of a CM signal in the incoming RF signal at a candidate frequency without demodulation of the CM signal or a priori knowledge of the CM signal. In one implementation, the processor may be a DSP to perform a CORDIC operation to determine the calculated magnitude.

Implementations may take many different forms and may be included in an integrated circuit (IC) for use in a portable device such as a mobile station, portable media player or the like. Still further, embodiments may be implemented in machine-readable instructions stored in a tangible storage medium such as a volatile or non-volatile storage device.

DETAILED DESCRIPTION

In various embodiments, a radio receiver such as may be present in a transceiver including both receive and transmit functionality may perform a blind scanning method to scan a radio spectrum, such as an FM radio spectrum for the presence of signals. Embodiments may detect the presence of a modulated signal in noise without necessarily extracting, or having any prior knowledge of the modulated signal. In some implementations, a desired range of operation may be at a SNR level in the range of −20 to 0 decibels (dB).

A transceiver, for example, incorporated in a portable device such as a cellular telephone, MP3 player or other personal media player, may operate in a transmit mode to transmit locally to a corresponding radio, e.g., of a car in which the portable device is present. Because the transmitter of the transceiver must overpower signals received at an antenna of the car, which may boost incoming FM signals, the blind scan method may be used to detect the presence or non-presence of FM signals at a given frequency. Furthermore, because the receiver of the transceiver operates at attenuated power levels because it may be present inside the car and furthermore operates using a low power antenna (as compared to the car or other associated antenna), to provide for suitable transmission and audio fidelity using the car radio, a channel may be selected for local transmission from the transceiver to the car radio that does not include any signal information, even at very low levels (e.g., at levels of −10 dB SNR and even lower).

In various embodiments, during operation of the transceiver, e.g., during a powering up or initiation of a FM transmit mode to provide local transmission of FM signals to a closely located receiver such as a car radio, a blind scan of the FM spectrum may be performed to find a suitable frequency for transmission. In some implementations, the method may be initiated by a host processor of the portable device although the scope of the present invention is not limited in this regard. For example, in other implementations the transceiver itself may be configured to initiate such a blind scan upon powering up or enabling of a FM transmit mode.

Figure 1:
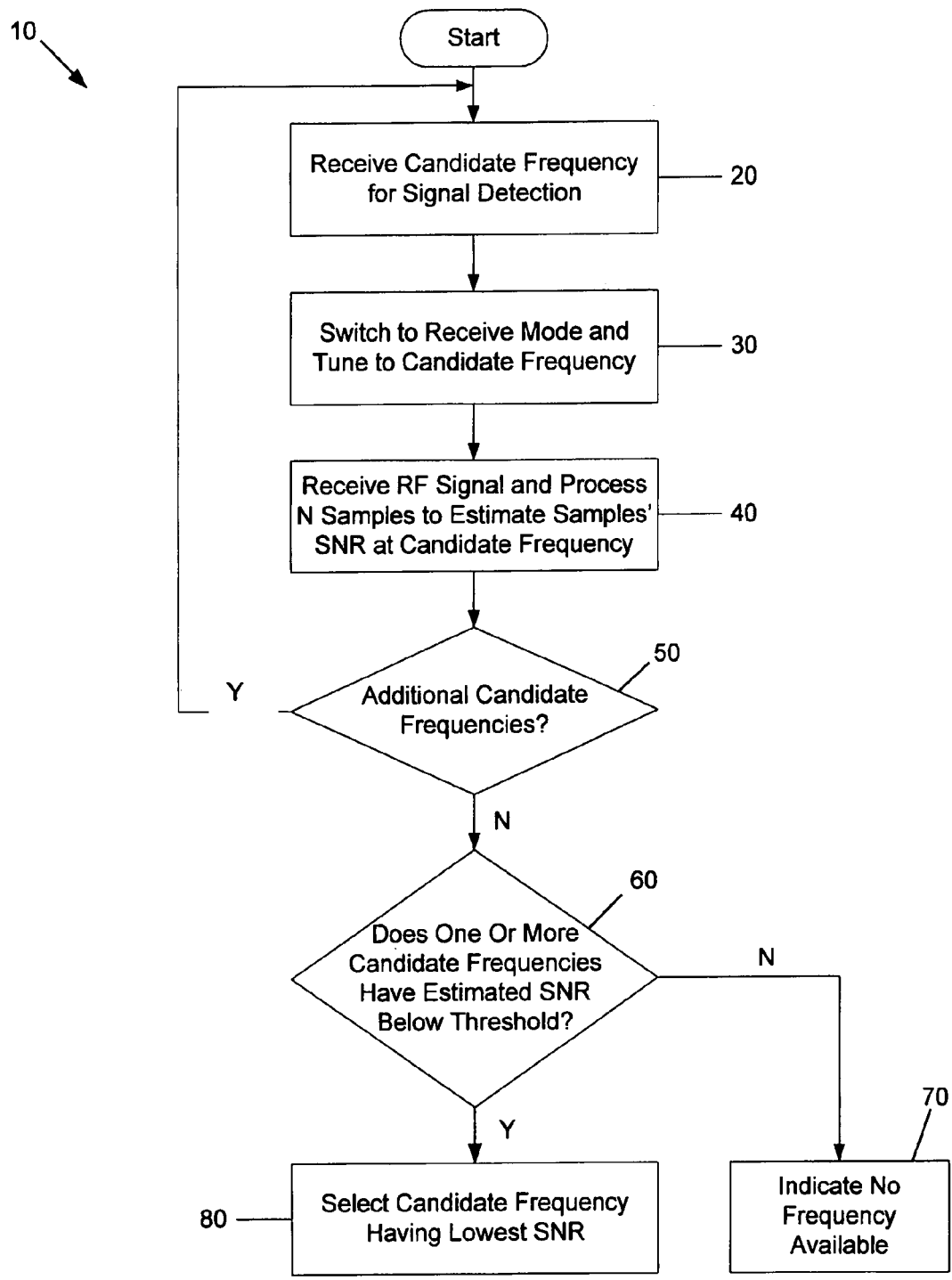
FIG. 1 is a flow diagram of a method in accordance of one embodiment of the present invention.

Referring now to FIG. 1, shown is a flow diagram of a method in accordance with one embodiment of the present invention. As shown in FIG. 1, method 10 may be performed by a portable device including a transceiver in accordance with an embodiment of the present invention. As shown in FIG. 1, method 10 may begin by receiving a candidate frequency for signal detection (block 20). For example, in some implementations a transceiver may receive a single candidate frequency (or multiple frequencies) from a host processor. Alternately, the transceiver itself may initiate the scanning based on one or more frequencies within the radio spectrum. For example, a scan may begin at a lowest portion of the FM spectrum and proceed through a number of different channels of the spectrum (e.g., in 200 kHz increments), although the scope of the present invention is not limited in this regard.

Referring still to FIG. 1, next the transceiver may be switched to a receive mode and the target frequency may be tuned (block 30). Accordingly, an incoming RF signal may be received at the candidate frequency and the received signal may be processed to determine its SNR (block 40). Note that rather than an actual determination of SNR, an estimation of the SNR level may be made, as will be discussed further below. In various embodiments, this signal processing may avoid demodulation such that even signals at negative SNR levels may be validly detected.

While the scope of the present invention is not limited in this regard, in various implementations different manners of processing the received signal may be effected to determine whether a valid FM signal is present at the candidate frequency. In some implementations an estimation may be performed on the RF signal. For example, a maximum likelihood estimator or a log likelihood estimator, or a moments analysis may be implemented to obtain an optimal estimate of signal amplitude for N number of samples at the candidate frequency.

Referring still to FIG. 1, at diamond 50 it may be determined whether additional candidate frequencies are to be analyzed. If so, control passes to block 20 discussed above. If not, control passes to diamond 60 where it may be determined whether one or more candidate frequencies have an SNR level below a given threshold. That is, based on the SNR estimate(s) calculated, a comparison to a threshold value may be performed. If none of the candidate frequencies have a value below the threshold, it may be indicated that no frequency is available for local FM transmission (block 70). Alternately, if one or more of the frequencies is below the SNR, control passes to block 80. Note that in the case where there is more than one candidate frequency having a suitable SNR level (i.e., below the threshold level) the candidate frequency having the lowest SNR may be selected for use for local FM transmission. In some implementations, the process steps performed at diamond 60 and blocks 70 and 80 may be performed in the transceiver itself, while in other implementations one or more of the steps may be performed by a host processor. While shown with this particular implementation in the embodiment of FIG. 1, the scope of the present invention is not limited in this regard.

Figure 2:
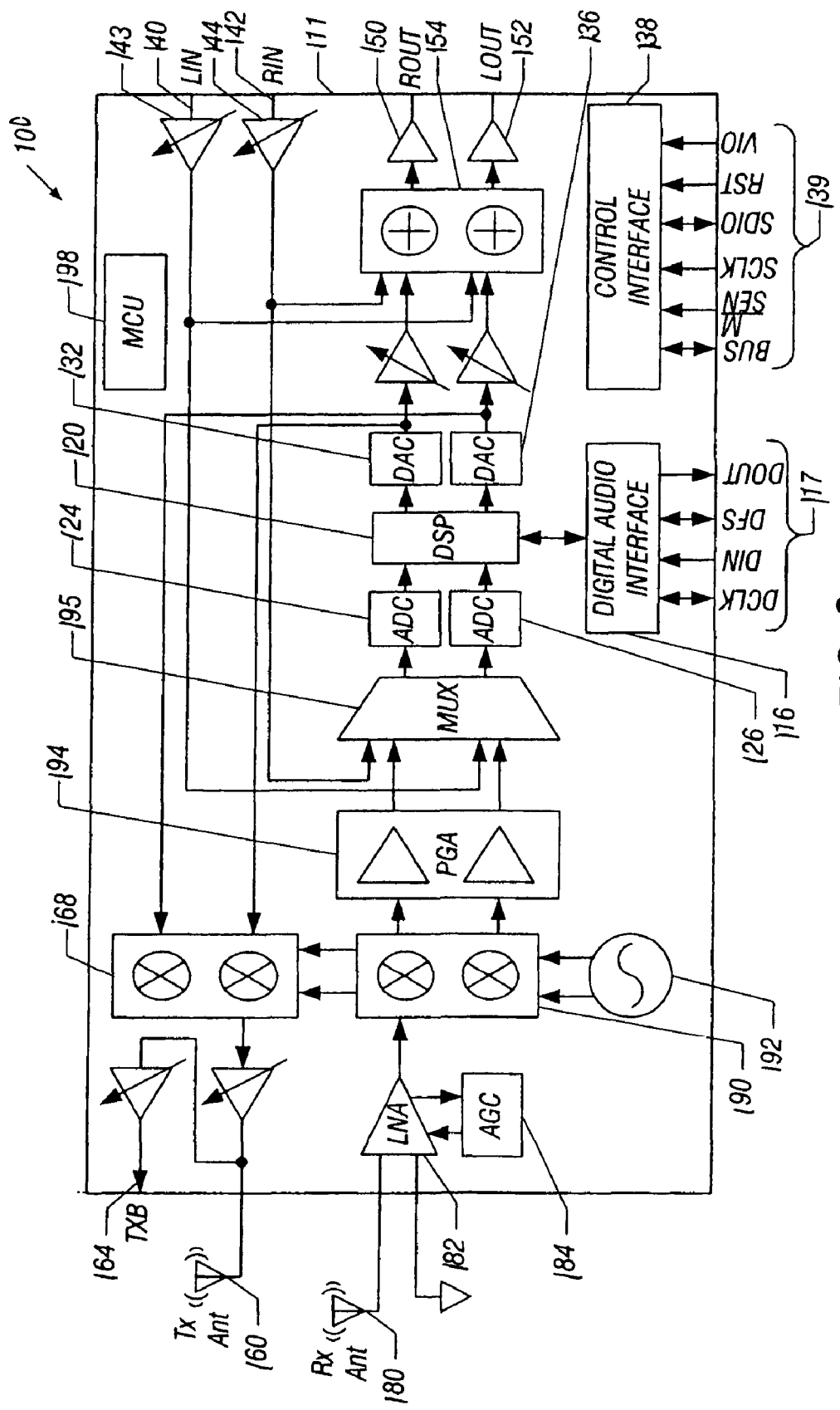
FIG. 2 is a block diagram of a transceiver in accordance with an embodiment of the present invention.

Embodiments may be implemented in many different receivers, transceivers and so forth. In some implementations, a radio transceiver capable of both AM and FM receive modes as well as at least an FM transmit mode may implement embodiments of the present invention. Referring now to FIG. 2, shown is a block diagram of a transceiver in accordance with an embodiment of the present invention. As shown in FIG. 2, a multimode combined AM/frequency modulation (FM) transceiver 100, which may be fabricated on a monolithic semiconductor die 110, has several different signal processing modes of operations, in which the transceiver 100 may perform FM transmission, AM or FM reception, analog mixing, digital mixing and codec functions. More specifically, as described herein, the multimode FM transceiver 100 has an FM transmit mode in which the transceiver 100 functions as an FM transmitter; an AM or FM receive mode in which the transceiver 10 functions as a receiver; and an audio mode in which the transceiver 100 functions as a codec. In each of these modes of operation, the multimode transceiver 100 may perform various analog and/or digital mixing functions. Additionally, in accordance with some embodiments of the invention, the multimode transceiver 100 includes a digital audio interface 116, which allows the communication of digital audio signals between the transceiver 100 and circuitry ("off-chip" circuitry, for example) that is external to the transceiver 100.

The multimode transceiver 100 may be in only one of the modes at a time, however, other embodiments of the invention, the multimode transceiver may operate in two or more of the modes concurrently. In general, the multimode transceiver 100 may receive one or more of the following input source signals in accordance with some embodiments of the invention: a digital audio (called "DIN"), which is received through the digital audio interface 116; an incoming RF signal that is received from an external receive antenna 118; a digital audio band signal that is received from the digital audio interface 116; and left channel (called "LIN") and right channel (called "RIN") analog stereo channel signals that are received at input terminals 140 and 142, respectively.

Depending on the particular configuration of the multimode transceiver 10, the transceiver 100 is capable of mixing two or more of its input source signals together to generate one or more of the following output signals: an outgoing FM transmission signal to drive an external transmit antenna 160; left channel (called "LOUT") and right channel (called "ROUT") analog stereo signals that appear at output terminals 152 and 150, respectively; and a digital output signal (called "DOUT") that is routed through the digital audio interface 116. The multimode transceiver 100 may also provide a low impedance RF transmission output signal (called "TXB") at an output terminal 164 for purposes of driving a low impedance load.

As described herein, the multimode transceiver 100 may reuse some of its hardware components for purposes of reducing the complexity and size of the transceiver 100, as well as reducing the overall design time. For example, in accordance with some embodiments of the invention, a digital signal processor (DSP) 120 of the multimode transceiver 100 performs both digital FM modulation (for the FM transmit mode) and digital AM and FM demodulation (for the receive mode) for the transceiver 100. As another example of the hardware reuse, analog-to-digital converters (ADCs) 124 and 126 of the multimode transceiver 100 perform transformations between the analog and digital domains for both complex (when the transceiver 100 is in the FM receive mode) and real (when the transceiver 100 is in the transmit modes) signals. Additionally, the ADCs 124 and 126 may be used in the audio mode for purposes of digitizing the LIN and RIN stereo channel signals.

As another example of hardware reuse by the multimode transceiver 100, in accordance with some embodiments of the invention, digital-to-analog converters (DACs) 132 and 136 of the transceiver 100 convert digital audio band signals from the digital to the analog domain for both the receive and audio modes. The DACs 132 and 136 are also used during the FM transmit mode for purposes of converting intermediate frequency (IF) band signals from the digital to the analog domain.

Turning now to the overall topology of the multimode transceiver 100, the transceiver 100 includes a multiplexer 195 for purposes of routing the appropriate analog signals to the ADCs 124 and 126 for conversion. For example, the multiplexer 195 may select an incoming analog IF signal during the receive mode and select the LIN and RIN stereo channel signals during the FM transmit and audio modes. The digital signals that are provided by the ADCs 124 and 126 are routed to the DSP 120.

For the receive modes, the multimode transceiver 100 includes analog mixers 190 that are coupled to a tunable local oscillator 192, the frequency of which selects the desired radio channel to which the transceiver 100 is tuned. In response to the incoming RF signal, the mixers 190 produce corresponding analog IF, quadrature signals that pass through programmable gain amplifiers (PGAs) 194 before being routed to the ADCs 124 and 126. Thus, the ADCs 124 and 126 convert the analog IF quadrature signals from the PGAs 194 into digital signals, which are provided to the DSP 120. The DSP 120 demodulates the received complex signal to provide corresponding digital left and right channel stereo signals at its output terminals; and these digital stereo signals are converted into the analog counterparts by the DACs 132 and 136, respectively. As described further below, mixing may then be performed by mixers, or analog adders 154, which provide the ROUT and LOUT stereo signals at the output terminals 150 and 152, respectively. It is noted that the digital demodulated stereo signals may also be routed from the DSP 120 to the digital audio interface 116 to produce the DOUT digital signal.

In the FM transmit mode of the multimode transceiver 100, the content to be transmitted over the FM channel (selected by the frequency of the local oscillator 192, for example) may originate with the DIN digital data signal, the LIN and RIN stereo channel signals or a combination of these signals. Thus, depending on whether the analog signals communicate some or all of the transmitted content, the multimode transceiver 100 may use the ADCs 124 and 126. The DSP 120 performs FM modulation on the content to be transmitted over the FM channel to produce digital orthogonal FM signals, which are provided to the DACs 132 and 136 to produce corresponding analog orthogonal FM signals, which are in the IF range. Analog mixers 168 (which mix the analog orthogonal FM signals with a frequency that is selected by the local oscillator 192) of the multimode transceiver 100 frequency translate and combine the signals to produce an RF FM signal that is provided to the transmit antenna 160. In the audio mode of the multimode transceiver 100, the DSP 120 may be used to perform digital mixing. Analog mixing in the audio mode may be performed using the adder 154.

The transceiver 100 includes a control interface 138 for purposes of receiving various signals 139 that control the mode (FM transmit, AM or FM receive or audio) in which the transceiver 100 is operating, as well as the specific submode configuration for the mode, as further described below. For example, different firmware present in the DSP 120 may be executed based on the selected mode of operation. In accordance with some embodiments of the invention, the multimode FM transceiver 100 may also include a microcontroller unit (MCU) 198 that coordinates the general operations of the transceiver 100, such as configuring the ADCs 124 and 126 and DACs 132 and 136, configuring data flow through the multiplexer 195, performing the blind scanning or the like.

As described above, different manners of estimating an incoming signal and deriving a SNR estimate therefrom may be realized. Various embodiments may take advantage of the fact that an FM signal is a constant modulo (CM) signal. The magnitude of a CM signal corrupted by noise can be modeled as a random variable R in accordance with Equation 1:

$$R = \sqrt{X^2 + Y^2} \qquad [1]$$

where X and Y are Gaussian random variables with a mean of $s/\sqrt{2}$ and a variance of $\sigma^2$ and in which $\sigma^2$ corresponds to the noise power of the complex I and Q portions of the signal s.

The probability distribution function (pdf) of R is given by a Ricean distribution:

$$P_R(r) = \frac{r}{\sigma^2} e^{-\frac{(r^2 + s^2)}{2\sigma^2}} I_0\left(\frac{rs}{\sigma^2}\right) \qquad [2]$$

where $I_0$ is a modified Bessel function of the first kind.

If we assume that received samples are statistically independent, the joint probability of N samples is:

$$P_R(r_0, r_1, \ldots, r_{N-1}) = \prod_i P_R(r_i) \qquad [3]$$

A maximum-likelihood estimator may be used to find the parameter s that maximizes the joint probability density function:

$$\hat{s} = \underset{s}{\operatorname{argmax}} \left\{ \prod_i p_R(r_i) \right\} \qquad [4]$$

Equivalently, the parameter s that maximizes the log-likelihood function may be obtained as follows:

$$\hat{s} = \underset{s}{\operatorname{argmax}} \left\{ \prod_i \ln p_R(r_i) \right\} \qquad [5]$$

The solution to this problem gives an optimal estimate $\hat{s}$ of the signal amplitude s.

To find s, the derivative of the log-likelihood function (with respect to s) may be set equal to zero:

$$\frac{d}{ds} \sum_i \ln p_R(r_i) = 0 \qquad [6]$$

$$\ln p_R(r) = \ln \frac{r}{\sigma^2} - \frac{r^2}{2\sigma^2} - \frac{s^2}{2\sigma^2} + \ln I_0\left(\frac{rs}{\sigma^2}\right) \qquad [7]$$

$$\frac{d}{ds} \ln p_R(r) = -\frac{s}{\sigma^2} + \frac{r}{\sigma^2} \frac{I_0'\left(\frac{rs}{\sigma^2}\right)}{I_0\left(\frac{rs}{\sigma^2}\right)} \qquad [8]$$

Figure 3:
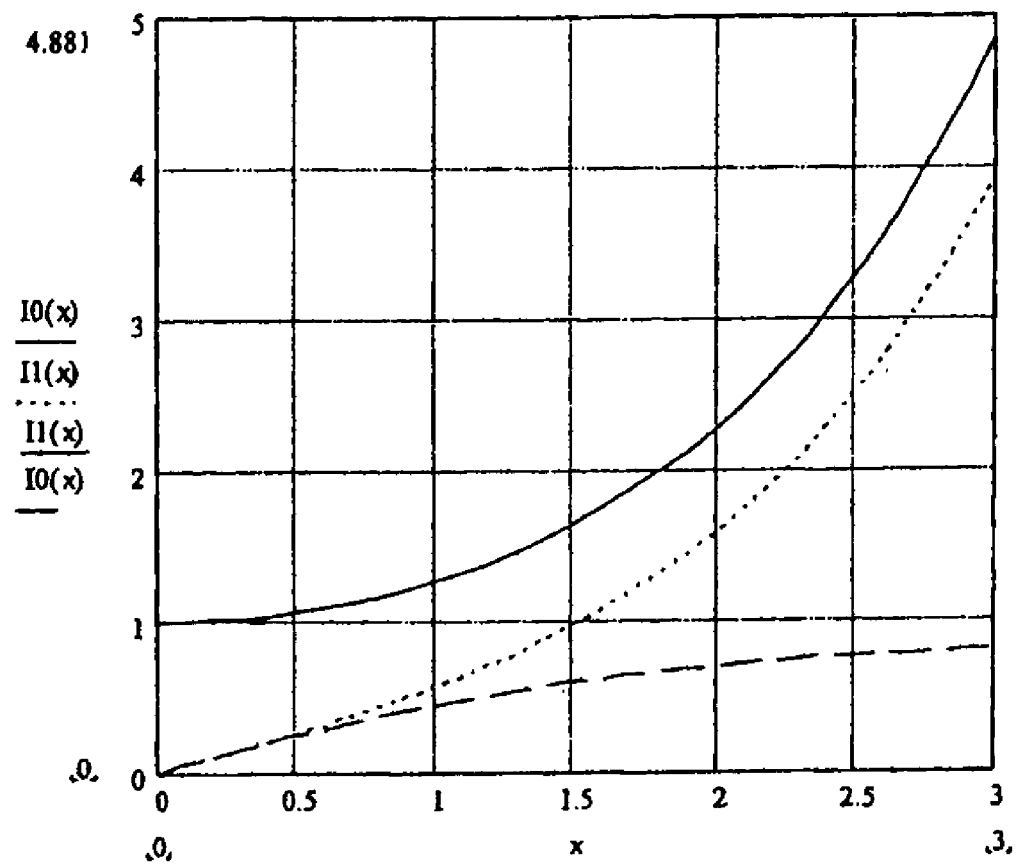
FIG. 3 is a graphical representation of a pair of modified Bessel functions and a ratio therebetween.

Note that the derivative of $I_0$ need not be performed, since by definition $I_0'=I_1$. FIG. 3 shows the two modified Bessel functions and their ratio. The ratio $$\frac{I_1(x)}{I_0(x)}$$

can be practically approximated by a second order polynomial of the form $Ax^2+Bx+C$.

Plugging the polynomial approximation into the derivative and collecting terms, the following may be obtained:

$$\left[\frac{A}{\sigma^4}\sum_i r_i^3\right]s^2 + \left[\frac{B}{\sigma^2}\sum_i r_i^2 - N\right]s + C\sum_i r_i = 0 \qquad [9]$$

The coefficients A, B, C may be pre-computed and stored in a lookup table or other storage. The positive root gives the optimal estimate of the signal amplitude (the other root is always negative). Accordingly, an estimate of the signal-to-noise ratio is formed as:

$$\frac{\hat{s}^2}{\sigma^2} \qquad [10]$$

If the signal-to-noise ratio is greater than a threshold, the estimator declares that a signal has been found, equivalently the condition for detection is:

$$\hat{s}^2 > D\sigma^2 \qquad [11]$$

where D is the threshold value.

Note that various tradeoffs may be made in configuring an estimator for desired performance. For example, a time versus range tradeoff may be made. That is, an increased time interval of the sampling (i.e., a greater number of N samples) extends the detection range. Other tradeoffs may be made with regard to a selected threshold for determining signal presence or non-presence. Specifically, a lower threshold decreases the probability of misses, while increasing the probability of false alarms. In contrast, a higher threshold decreases the probability of false alarm while increasing the probability of misses. The scope of the present invention is not limited in regard to the threshold chosen.

In order to obtain a reliable range of operation and set an appropriate threshold, the estimator may be run over a large number of trials or simulations, and statistics collected. The cases of interest for detecting presence of an FM signal are where there is no signal (noise only) and the case in which a signal is present at various levels. To determine presence or non-presence of a signal at a given channel, probability density functions of the estimator output may be constructed from the sampled data. Using these functions, the probability of detection and the probability of false alarm may be determined for a given threshold.

The received signal may be provided to an estimator from various portions of a receive chain of a receiver. For example, in some implementations, the received signal may be provided to the estimator after passing through analog front-end circuitry of the receiver such as a low noise amplifier (LNA), mixing circuitry, and other circuitry such as other gain stages, conversion circuitry to convert the incoming analog signal to a digital value and so forth. Furthermore, in some implementations the signal may be passed through a band limiting filter.

In various implementations, the estimator may be realized as hardware, software, firmware, or combinations thereof. For example, with respect to the embodiment of FIG. 2, DSP 120 may perform the estimator operations. As an example, DSP 120 may be configured to perform a coordinate rotation digital computer (CORDIC) function to obtain the magnitude information. Note that the squaring, summing, and square root operations described above with regard to Equation 1 may be implemented as a single operation, since a CORDIC engine may convert rectangular coordinates (i.e., x, y) to polar coordinates (r, Θ). Alternately, the estimator may be performed via a CORDIC coprocessor or other hardware.

Figure 4:
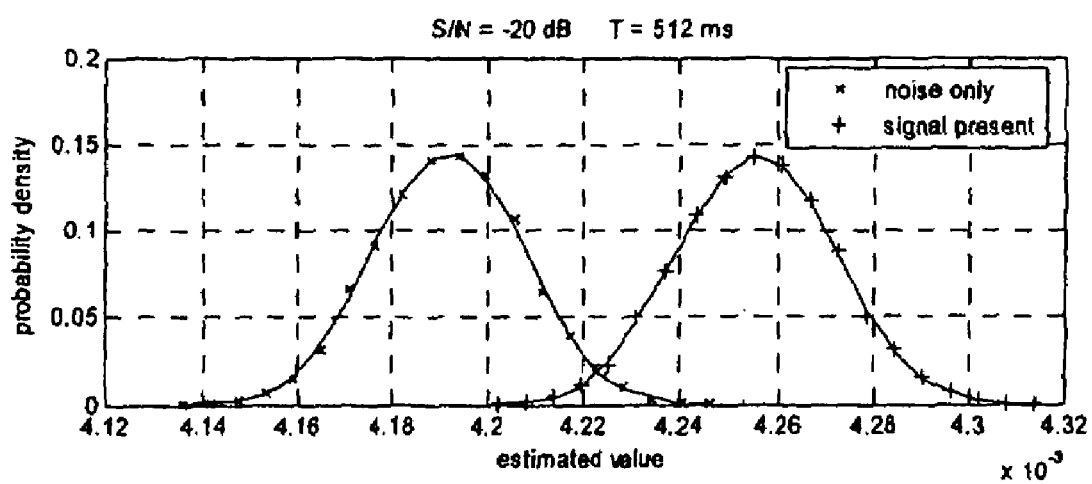
FIG. 4 is a graphical representation of probability distribution functions in accordance with an embodiment of the present invention.
Figure 5:
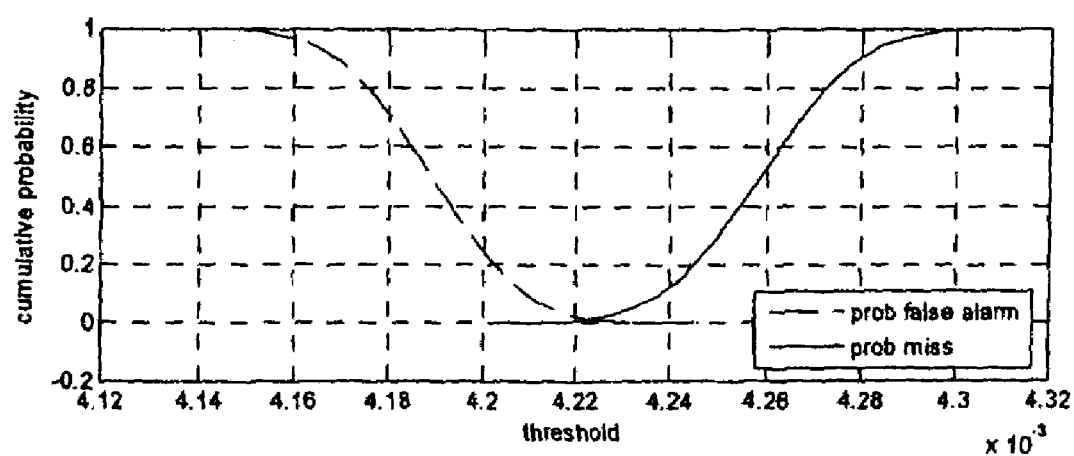
FIG. 5 is a graphical representation of a cumulative probability of signal detection/miss in accordance with another embodiment of the present invention.

Referring to FIGS. 4 and 5, shown are graphical representations of probability density versus estimated thresholds and a cumulative probability versus threshold. As shown in FIG. 4, simulations were performed at an SNR of −20 dB and with a sampling time of 512 ms. The probability distribution functions shown are for simulations performed in which there was no signal present (i.e., noise only) and in which a signal was present at a given signal level. FIG. 4 shows the probability density functions for the two cases. For a given threshold, the probability of detection is given by the area under the + curve for values greater than the threshold. Likewise, the probability of a false alarm is given by the area under the x curve for values greater than the threshold. FIG. 5 shows the probability of false alarm and the probability of miss (not detecting a signal). The point at which the two curves intersect gives the threshold at which the two probabilities are equal. Note that requiring that the probabilities be equal is only one possible criterion for setting the threshold. A lower threshold decreases the probability of miss while increasing the probability of false alarm. The converse is true for a higher threshold: the probability of false alarm is decreased at the expense of a higher probability of miss.

Note that performing a maximum log likelihood as described above assumes that $\sigma^2$ (i.e., the variance of the underlying Gaussian noise process) is a known function. However, this may not be the case for CM signals. Thus if a variance of R is used as an estimate of $\sigma^2$, performance may degrade, reducing the detection range (e.g., in terms of SNR).

Accordingly, in other implementations an estimation method may be performed that finds maximum-likelihood estimates for both the signal value, s and $\sigma^2$. More specifically, maximum-likelihood estimates of s and $\sigma^2$ may be determined as follows:

$$\underset{s,\sigma^2}{\mathrm{argmax}}\left\{\sum_i \ln p_R(r_i)\right\} \qquad [12]$$

$$p_R(r) = \frac{r}{\sigma^2}e^{\frac{-(r^2+s^2)}{2\sigma^2}}I_0\left(\frac{rs}{\sigma^2}\right) \qquad [13]$$

$$\nabla_s \equiv \frac{d}{ds}\ln p(r_i) = \frac{-s^2}{\sigma^2} + \frac{r}{\sigma^2}\frac{I_1\left(\frac{rs}{\sigma^2}\right)}{\left(\frac{rs}{\sigma^2}\right)} \qquad [14]$$

$$\nabla_{\sigma^2} \equiv \frac{d}{d\sigma^2}\ln p(r_i) = \frac{s^2+r}{2} - \sigma^2 - \frac{I_1\left(\frac{rs}{\sigma^2}\right)}{I_0\left(\frac{rs}{\sigma^2}\right)} \qquad [15]$$

Approximating the modified Bessel function ratio by a second degree polynomial and collecting terms we get:

$$\nabla_s = \frac{1}{\sigma^2}\left(\left[\frac{A}{\sigma^4}\sum_i r_i^2 - N\right]s + C\sum_i r_i\right) \quad [16]$$

$$\nabla_{\sigma^2} = \left[\frac{A}{\sigma^4}\sum_i r_i^3\right]s^3 + \left[\frac{B}{\sigma^2}\sum_i r_i^2 - \frac{N}{2}\right]s^2 + \left[C\sum_i r_i\right]s + N\sigma^2 - \frac{1}{2}\sum_i r_i^2 \quad [17]$$

Setting both derivatives of zero yields (after some manipulation):

$$\sigma^2 = \frac{s^2}{2} + \frac{1}{2N}\sum_i r_i^2 \quad [18]$$

A closed form solution can be obtained by substituting this equation into:

$$\left[\frac{A}{\sigma^4}\sum_i r_i^3\right]s^2 + \left[\frac{B}{\sigma^2}\sum_i r_i^2 - N\right]s + C\sum_i r_i = 0 \quad [19]$$

A closed form solution is in the form of a fourth order polynomial in s. Alternatively, the problem may be solved iteratively using a steepest ascent algorithm in accordance with Equations 20 and 21:

$$s_n = s_{n-1} + k_1 \nabla_s \quad [20]$$

$$\sigma_n^2 = \sigma_{n-1}^2 + k_2 \nabla_{94^2} \quad [21]$$

where $k_1$ and $k_2$ are constants related to the convergence properties of the algorithm.

Statistics of a Ricean process are related to statistics of an underlying Gaussian process as follows:

$$M \equiv E(r) = \sigma\sqrt{\frac{\pi}{2}} L_{1/2}\left(\frac{-s^2}{2\sigma^2}\right) \quad [22]$$

where E(r) is the first moment of R (i.e., mean), and $L_{1/2}$ is a Laguerre polynomial defined as:

$$L_{1/2}(x) = e^{x/2}\left[(1-x)I_0\left(\frac{-x}{2}\right) - xI_1\left(\frac{-x}{2}\right)\right] \quad [23]$$

$$V \equiv E(r^2) - E(r)^2 = 2\sigma^2 + s^2 - M^2 \quad [24]$$

Note that M (mean) and V (power) can be measured directly. $L_{1/2}$ may be approximated by a polynomial over the range of interest as follows:

$$L_{1/2}(x) \approx Ax + B \quad [25]$$

After some manipulation, the following expression may be obtained:

$$(A+B)\sigma^2 - \frac{M}{\sqrt{\frac{\pi}{2}}}\sigma - \frac{A}{2}(V + M^2) = 0 \quad [26]$$

$$s^2 = V + M^2 - 2\sigma \quad [27]$$

In yet other implementations, the second and fourth raw moments of the Rice distribution may be used as follows, where $\mu_2$ is the second moment and $\mu_4$ is the fourth moment.

$$E(r^2) \equiv \mu_2 = 2\sigma^2 + s^2 \quad [28]$$

$$E(r^4) \equiv \mu_4 = 8\sigma^4 + 8\sigma^2 s^2 + s^4 \quad [29]$$

$$2\mu_2^2 - \mu_4 = s^4 \quad [30]$$

$$s^2 = \sqrt{2\mu_2^2 - \mu^4} \quad [31]$$

$$\sigma^2 = \frac{\mu_2 - s^2}{2} \quad [33]$$

Thus using the second and fourth moments, a SNR estimate for a plurality of N samples may be obtained and compared to a threshold to determine signal presence.

In yet other embodiments, a combined approach in which $\mu^2$ may be estimated from a moments method or a variance of r, which then can be used to compute a maximum-likelihood estimate for s may be performed.

Figure 6:
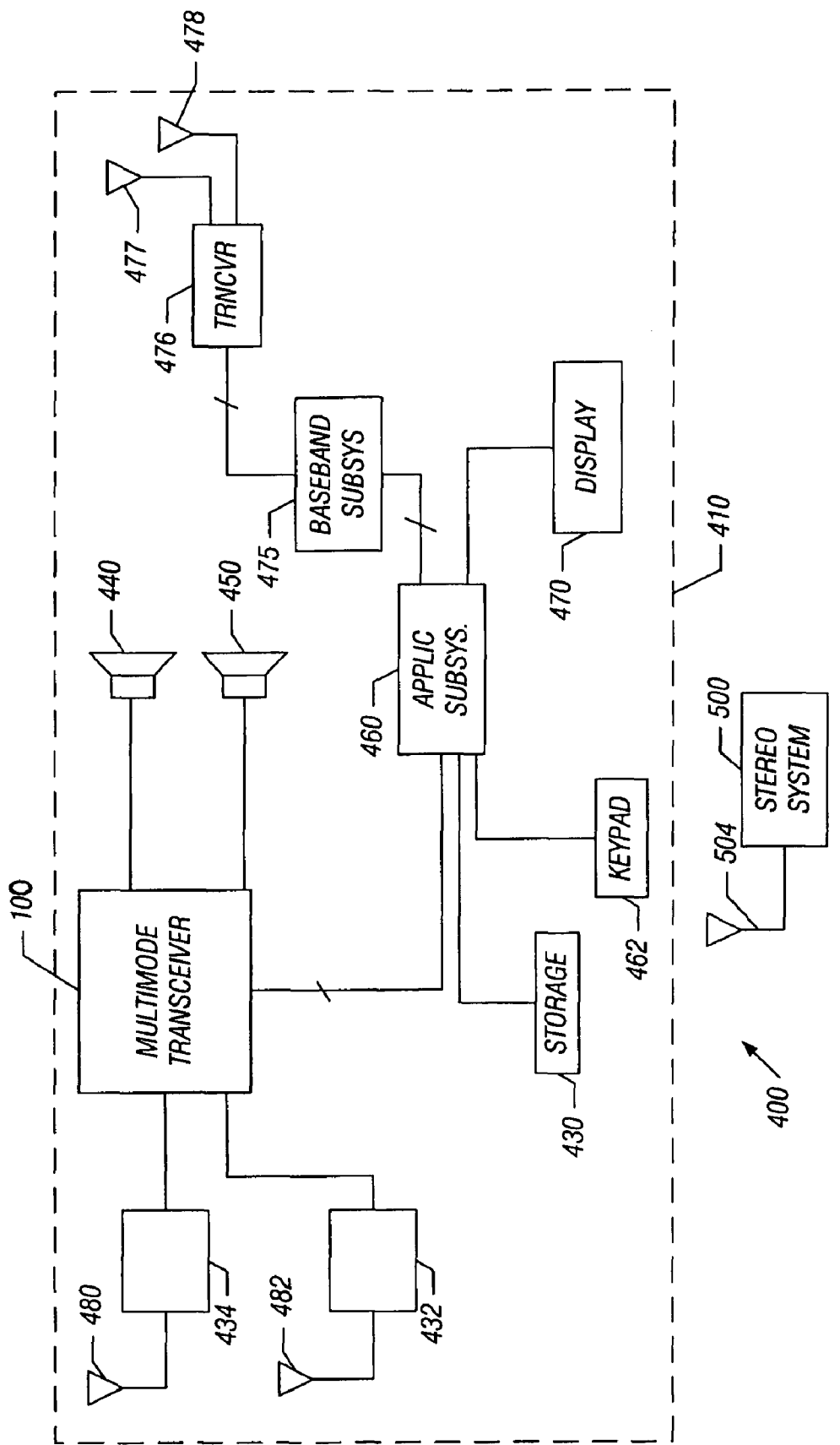
FIG. 6 is a block diagram of a system in accordance with one embodiment of the present invention.

Referring to FIG. 6, in accordance with some embodiments of the invention, a transceiver 100 may be part of a multimedia portable wireless device 410, which, in turn, is part of a wireless system 400. As examples, the wireless device 410 may be a dedicated portable media player, a cellular telephone or PDA with the capability of playing music downloads, part of a wireless link between a satellite antenna and an FM receiver, etc.

Among its other various functions, the wireless device 410 may store digital content such as audio files in a given digital audio format on a storage 430, which may be a flash memory or hard disk drive, as a few examples. The wireless device 410 generally includes an application subsystem 460 that may, for example, receive input from a keypad 462 of the wireless device 410 and display information on a display 470. Furthermore, the application subsystem 460 may generally control the retrieval and storage of content from the storage 430 and the communication of, e.g., audio with a multimode transceiver 100. The application subsystem 460, which may be a host processor of the wireless device 410, may instruct the transceiver 100 to perform a scan of one or more frequencies in the FM spectrum and determine the presence or non-presence of signals. As shown, the multimode transceiver 10 may be directly connected to speakers 440 and 450 for output of audio data. As depicted in FIG. 6, the multimode transceiver 100 may be coupled by a matching network 434 to a receiver antenna 480 and may be coupled by a matching network 432 to the transmit antenna 482.

Although the wireless device 410 may include the speakers 440 and 450, it may be desirable to play sounds that are generated by the wireless device 410 over a more sophisticated speaker system. Therefore, in accordance with some embodiments of the invention, the wireless device 410, via the multimode FM transceiver 100, may broadcast content to be played over an FM channel to the receiver of an adjacent stereo system 500 of a car radio (as an example). Note that the transmit antenna 482, when transmitting local FM signals to the stereo system 500 must overpower signals received at the car radio antenna 504 which may boost received signals. Furthermore, note that the receiver antenna 480 of the wireless device 410 may receive attenuated signals when scanning for an appropriate FM channel, as the FM spectrum may be attenuated at the location of the wireless device 410 (e.g., within the car itself). As shown, the stereo system 500 includes the RF antenna 504 for purposes of receiving the transmitted content from the wireless device 410, and which may correspond to the car radio antenna, in some embodiments. Note that a blind scanning method such as that described herein may be implemented in the transceiver 100 (and application subsystem 460) using a program stored in a machine-readable storage medium and which may be executed by the transceiver 100 and/or the application subsystem 460.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:
   receiving an incoming radio frequency (RF) signal in a receiver;
   providing the incoming RF signal to an estimator to estimate a signal-to-noise ratio (SNR) of a signal at a first candidate frequency in the incoming RF signal without demodulating the incoming RF signal based on a calculated magnitude for each of a plurality of samples of the incoming RF signal; and
   indicating presence of a modulated signal corresponding to the signal at the first candidate frequency in the incoming RF signal if the estimated SNR is greater than a threshold and indicating non-presence of the modulated signal if the estimated SNR is less than the threshold.

2. The method of claim 1, further comprising downconverting and digitizing the incoming RF signal and providing the digitized signal to a digital signal processor (DSP), wherein the DSP includes the estimator.

3. The method of claim 2, further comprising performing a coordinate rotation digital computer (CORDIC) function in the DSP to calculate the magnitude for each of the plurality of samples.

4. The method of claim 2, further comprising generating the SNR estimate based on the calculated magnitude and a noise power of the signal, the signal corresponding to a complex signal.

5. The method of claim 4, wherein estimating the SNR comprises performing a maximum log likelihood analysis for the calculated magnitude and the noise power of the plurality of samples.

6. The method of claim 4, wherein estimating the SNR comprises performing a moments analysis for the calculated magnitude of the plurality of samples.

7. The method of claim 6, further comprising calculating a second moment and a fourth moment of a Ricean distribution corresponding to the calculated magnitude for the plurality of samples.

8. The method of claim 1, further comprising receiving a blind scan instruction from a host processor of a system including the receiver, performing the SNR estimating and the indicating at a plurality of candidate frequencies of a radio spectrum, wherein the receiver is part of a transceiver.

9. The method of claim 8, further comprising selecting one of the plurality of candidate frequencies having a lowest SNR estimate for transmission of audio content from the transceiver to a remote radio receiver.

10. The method of claim 9, wherein the remote radio receiver comprises a car radio having an antenna with a higher power level than a power level of an antenna coupled to the transceiver.

11. The method of claim 1, further comprising receiving the incoming RF signal in a transceiver of a portable device having an antenna of a first power level and transmitting content from the transceiver to a second receiver at a frequency at which the estimated SNR is less than the threshold.

12. The method of claim 11, wherein the second receiver is coupled to a second antenna of a second power level greater than the first power level.

13. The method of claim 1, further comprising estimating the SNR according to $R=\sqrt{X^2+Y^2}$, where X and Y are Gaussian random variables with a mean of $$\frac{s}{\sqrt{2}}$$

and a variance of $\sigma^2$, where s is the signal and $\sigma^2$ corresponds to noise power of complex portions of the signal.

14. The method of claim 13, further comprising determining the presence of the modulated signal if $\hat{s}^2$ is greater than $D\sigma^2$, wherein D is a threshold value and $\hat{s}$ is an estimate of s.

15. An apparatus comprising:
   a transceiver to receive and transmit radio signals, the transceiver including:
     a receiver having a low noise amplifier (LNA) to amplify an incoming radio frequency (RF) signal;
     a mixer to downconvert the RF signal to a second frequency signal;
     a digitizer coupled to the mixer to digitize the second frequency signal;
     a processor coupled to the digitizer to process the digitized second frequency signal, wherein the processor is to determine presence of a signal in the incoming RF signal at a candidate frequency without demodulation of the signal, based on a calculated magnitude for each of N samples of the incoming RF signal, the processor comprising a digital signal processor (DSP) to perform a coordinate rotation digital computer (CORDIC) operation to determine the calculated magnitude; and
     a demodulator coupled to the processor to demodulate a signal present in the incoming RF signal in a receive mode of operation.

16. The apparatus of claim 15, wherein the transceiver is to estimate a signal-to-noise ratio (SNR) based on the calculated magnitude and perform a comparison of the estimated SNR to a threshold.

17. The apparatus of claim 16, wherein the transceiver is to estimate the SNR and perform the comparison at a plurality of frequencies and select one of the plurality of frequencies having a SNR estimate below the threshold for use for radio transmission.

18. The apparatus of claim 15, further comprising a second processor coupled to the transceiver, the second processor to instruct the transceiver to perform a blind scan of at least a portion of a radio spectrum including the candidate frequency.

19. A system comprising:
   a transceiver to receive and transmit radio signals, the transceiver including:
      a receiver having an amplifier to amplify an incoming radio frequency (RF) signal;
      a mixer to downconvert the RF signal to an intermediate frequency (IF) signal;
      an analog-to-digital converter (ADC) coupled to the mixer to digitize the IF signal;
      a digital signal processor (DSP) coupled to the ADC to process the digitized IF signal, wherein the DSP is to perform a blind scan detection for a signal in the incoming RF signal at a candidate frequency without demodulation of the signal, based on a comparison of an estimated signal-to-noise ratio (SNR) of the signal obtained from a calculated magnitude for each of a plurality of samples of the signal to a threshold and the transceiver is to detect a signal having a SNR of less than 0 decibels; and
      a demodulator coupled to the DSP to demodulate a signal present in the incoming RF signal in a receive mode of operation;
   a host processor coupled to the transceiver to instruct the transceiver to perform the blind scan detection; and
   a non-volatile storage to store digital audio content.

20. The system of claim 19, wherein the transceiver is to estimate the SNR of a plurality of candidate frequencies, and the host processor is to instruct the transceiver to transmit the digital audio content at the one of the plurality of candidate frequencies having the lowest SNR estimate.

21. The system of claim 19, wherein the system comprises a portable media player having an antenna of a first power level, and wherein the first power level is less than a power level of a second antenna with which the system is to communicate, the second antenna comprising a receive antenna for a remote receiver.

\* \* \* \* \*